United States Patent [19]

Yamamoto et al.

[11] Patent Number: 5,682,063
[45] Date of Patent: Oct. 28, 1997

[54] SUBSTRATE FOR SEMICONDUCTOR DEVICE

[75] Inventors: Yoshiyuki Yamamoto; Takahiro Imai; Naoji Fujimori, all of Itami, Japan

[73] Assignee: Sumitomo Electric Industries, Ltd., Osaka, Japan

[21] Appl. No.: 583,542

[22] Filed: Jan. 5, 1996

Related U.S. Application Data

[63] Continuation of Ser. No. 250,501, May 27, 1994, abandoned.

[30] Foreign Application Priority Data

May 28, 1993 [JP] Japan ................................ 5-126544

[51] Int. Cl.⁶ ............................ H01L 23/053; H01L 23/12
[52] U.S. Cl. ............................ 257/700; 257/77; 257/702; 257/705; 257/750
[58] Field of Search ............................ 257/77, 700, 702, 257/705, 707, 750

[56] References Cited

U.S. PATENT DOCUMENTS

| 5,239,746 | 8/1993 | Goldman | 29/840 |
| 5,298,749 | 3/1994 | Inushima | 250/338.4 |

FOREIGN PATENT DOCUMENTS

| 221531A3 | 5/1987 | European Pat. Off. |
| 276004A3 | 7/1988 | European Pat. Off. |
| 282075A3 | 9/1988 | European Pat. Off. |
| 0517264 | 12/1992 | European Pat. Off. |
| 534355A1 | 3/1993 | European Pat. Off. |
| 60-128697 | 7/1985 | Japan |
| 61-251158 | 11/1986 | Japan |
| 63-293931 | 11/1988 | Japan |
| 2-023639 | 1/1990 | Japan |
| 2015625 | 1/1990 | Japan |
| 2023639 | 1/1990 | Japan |
| 2-044757 | 2/1990 | Japan |
| 4264797 | 9/1992 | Japan |

OTHER PUBLICATIONS

Patent Abstracts of Japan, vol. 17, No. 276 (E–1372) May 27, 1993 & JP-A-05 013 610 (Fujitsu Ltd) Jan. 22, 1993 *abstract*.

Patent Abstracts of Japan, vol. 6, No. 222 (E–140) Nov. 6, 1982 & JP-A-57 126 154 (Nippon Denki K.K.) Aug. 5, 1982 *abstract*.

Charles, Jr., "Packaging With Multichip Modules", IEEE/CHMT Int'l Electronics Manufacturing Technology Symposium pp. 206–210 no date.

"Comprehensive Electronic Part Handbook (Sogo Densibuhin Handbook)" edited by Nihon Denshikikai Kogyokai, pp. 1120–1123. no date.

*Primary Examiner*—Tom Thomas
*Assistant Examiner*—David Ostrowski
*Attorney, Agent, or Firm*—Cushman Darby & Cushman IP Group of Pillsbury Madison & Sutro LLP

[57] ABSTRACT

The present invention relates to a substrate for a semiconductor device having a diamond base material and a multisublayer wiring layer on the diamond base material, wherein the diamond base material is a diamond layer prepared by vapor phase deposition. The multisublayer wiring layer has at least one insulating sublayer having a relative dielectric constant of not larger than 5 or at least 12 and at least one metal wiring sublayer. The present invention is particularly useful as a substrate for a high performance, high-speed operation semiconductor device.

13 Claims, 1 Drawing Sheet

SUBSTRATE FOR SEMICONDUCTOR DEVICE

This is a continuation of application Ser. No. 08/250,501, filed on May 27, 1994, which was abandoned upon the filing hereof.

BACKGROUND OF THE INVENTION

1. Field of the Invention

The present invention relates to a multilayered wiring substrate for mounting a semiconductor element, particularly to a multilayered wiring substrate having a high density for mounting a semiconductor element and for performing at high speed operation, and to a method for the preparation thereof.

2. Description of the Related Art

With the recent rapid development of the compact, the light-weight and high performance work station and personal computer, it is required that semiconductor elements equipped in these electronic instruments perform at high speed and have a high mounting density. Consequently, a heat quantity per unit area dissipated by the semiconductor element is rapidly increased, and a mean for efficiently dissipating the heat is required. With the high speed operation of the semiconductor element, the delay of signal transmission in a wiring of a package cannot be neglected, and the package is required to have a high heat dissipation property as well as a low dielectric constant.

For example, Japanese Patent Kokai Publication No. 251158/1986 discloses that a heat-dissipating substrate comprises diamond which contains an impurity for improving electrical conductivity and is prepared by vapor phase deposition. Japanese Patent Kokai Publication No. 44757/1990 discloses a three-dimensional integrated circuit which comprises a laminate of at least three layers having at least one semiconductive layer and at least one electrically insulating layer of diamond. Japanese Patent Kokai Publication No. 23639/1990 discloses a multilayered circuit substrate which comprises a diamond base material prepared by vapor phase deposition, wherein wiring multilayers are formed on a base material surface, and an interlaminar insulating diamond layer is positioned between the wiring multilayers and is prepared by vapor phase deposition. Japanese Patent Kokai Publication No. 293931/1988 discloses a semiconductor device having heat-dissipating bump electrodes which are formed by using a diamond thin film as a base material. Japanese Patent Kokai Publication No. 23639/1990 discloses a multilayer circuit substrate which comprises a diamond base material prepared by vapor phase deposition, wherein wiring multilayers are formed on a base material surface and an interlaminar insulating diamond layer is prepared by vapor phase deposition and is positioned between the wiring multilayers.

Although alumina and multilayered wiring alumina are mainly used as a substrate for mounting semiconductor elements, the thermal conductivities thereof are low so that it is difficult to mount the elements having a high performance and a large heating capacity on such substrates. Therefore, an auxiliary means for dissipating the heat such a compulsory air-cooling is necessary. However, the presence of an auxiliary means decreases the compaction and increases the low cost of the product. Although highly thermally conductive ceramics such as aluminum nitride and silicon carbide are developed to be used as the substrate material, these materials suffer from the problems that the thermal conductivity is insufficient and that the signals are delayed due to the high dielectric constant.

Japanese Patent Kokai Publication No. 128697/1985 and the like disclose that diamond, having the highest thermal conductivity among all substances and the low dielectric constant which is prepared by vapor phase deposition can be used as a material for the substrate for mounting the semiconductor elements. However, diamond prepared by vapor phase deposition has a rough surface, and the processing (such as the perforation) and the wiring is difficult. As to a via-hole processing, a method for processing diamond comprising using YAG laser is disclosed in Japanese Patent Kokai Publication No. 23639/1990. But, diamond suffers from the problems that it is transparent to a wavelength of YAG laser (1.06 μm) and that it has a very low processing efficiency. Although diamond has a comparatively low dielectric constant, the relative dielectric constant of diamond is only 5.7. The dielectric constant of diamond is too high for the recently developed high performance elements which operate at a clock frequency of larger than 100 MHz and the signals are delayed.

SUMMARY OF THE INVENTION

In view of the above problems, we intensively studied and found that a structure having a diamond layer, and a multisublayer wiring layer formed by a metal and an insulating material, gives both the good thermal conductivity and the good dielectric constant which sufficiently satisfy the above requirements for the substrate. When a high dielectric constant insulating sublayer is used as the insulating material, a stable source voltage can be supplied. We also found that holes for a passing-through wiring can be prepared and a surface of a vapor phase deposition diamond can be smoothed when a excimer laser having a short wavelength is used for a processing method.

The present invention provides a substrate for a semiconductor device comprising a diamond base material and a multisublayer wiring layer on the diamond base material, wherein the diamond base material is a diamond layer prepared by vapor phase deposition, and the multisublayer wiring layer comprises at least one low dielectric constant insulating sublayer having a relative dielectric constant of not larger than 5 and at least one metal wiring sublayer.

The present invention also provides a substrate for a semiconductor device comprising a diamond base material and a multisublayer wiring layer on the diamond base material, wherein the diamond base material is a diamond layer prepared by vapor phase deposition, and the multisublayer wiring layer comprises at least one high dielectric constant insulating sublayer having a relative dielectric constant of at least 12 and at least one metal wiring sublayer.

Further, the present invention provides a substrate for a semiconductor device comprising a diamond base material and a plurality of multisublayer wiring layers on the diamond base material, wherein the diamond base material is a diamond layer prepared by vapor phase deposition, at least one multisublayer wiring layer comprises at least one low dielectric constant insulating sublayer having a relative dielectric constant of not larger than 5 and at least one metal wiring sublayer and at least one multisublayer wiring layer comprises at least one high dielectric Constant insulating sublayer having a relative dielectric constant of at least 12 and at least one metal wiring sublayer.

In addition, the present invention provides a substrate for a semiconductor device comprising a diamond base material and a multisublayer wiring layer on the diamond base material, wherein the diamond base material is a diamond layer prepared by vapor phase deposition, the multisublayer wiring layer comprises at least one diamond insulating sublayer prepared by vapor phase deposition and at least one metal wiring sublayer, and the diamond insulating sublayer and the metal wiring sublayer are alternatively positioned.

DETAILED DESCRIPTION OF THE INVENTION

Figure 1:
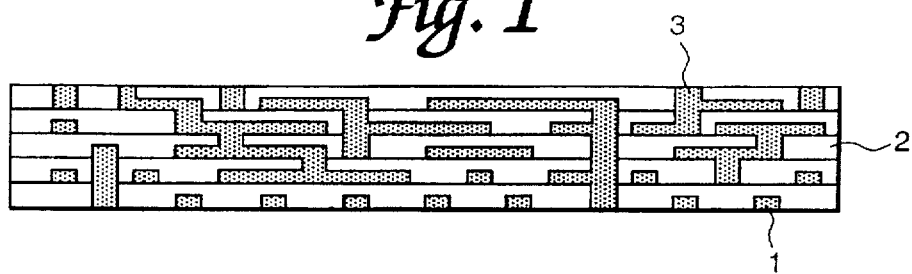
FIG. 1 shows a schematic cross-sectional view of a multisublayer wiring layer according to an embodiment of the present invention.

The present invention is explained hereinafter. A multilayered wiring substrate having a multisublayer wiring layer shown in FIG. 1 can be prepared by positioning a diamond layer on a substrate material such as polycrystalline Si, and then alternatively positioning at least one metal sublayer and at least one insulating sublayer (for example, a diamond sublayer prepared by vapor phase deposition). The multisublayer wiring layer shown in FIG. 1 has a wiring part 1 made from a metal such as W and Cu, an insulating part 2 made of an insulating material such as diamond, polyimide and $Ta_2O_5$, and an interlaminar wiring part 3. The multisublayer wiring layer of FIG. 1 has five insulating sublayers. Preferably, the first non-doped diamond layer positioned directly on the substrate material has a thickness of at least 100 μm, more preferably from 200 to 2,000 μm, and may be a self-standing film prepared by removing the first diamond layer from the substrate material through a treatment such as an acid treatment. The metal wiring sublayer can be prepared by forming a metal layer on diamond by sputtering, deposition, CVD or the like and then patterning the metal layer. Alternatively, the metal wiring sublayer can be prepared by forming a pattern from fine metal particles using a printing procedure. Exemplary material for the metal wiring sublayer, which can withstand a high temperature during the diamond growth, are a high melting-point metal such as Cu, W, Mo, Ta, Nb, Au, Ag, Si and Ni, and a carbide, nitride, silicide and boride thereof.

The insulating sublayer (for example, non-doped diamond layer) is further positioned on the wiring sublayer to prepare the multilayered wiring substrate. As stated above, non-doped diamond has a relative dielectric constant of 5.7, which is relatively low in comparison with alumina and the like, but which is high in view of the interlaminar insulating sublayer for the wiring layer so that the problem of signal delay arises in the high-speed semiconductor device. In order to solve this problem, the low dielectric constant insulating sublayer having the narrow spaces between the wiring is further positioned on diamond. The low dielectric constant insulating sublayer can be formed from a polyimide, a low dielectric constant glass and the like, which are conventionally used for a multilayered wiring substrate. The method for the preparation of polyimide-Cu multilayered wiring substrate may be a plated through-hole method which is described in "Comprehensive Electronic Part Handbook (Sogo Densibuhin Handbook)" edited by Nihon Denshikikai Kogyokai, page 1121. The low dielectric constant sublayer has a relative dielectric constant of not larger than 5, preferably not larger than 4, so that it has the characteristic which is not possessed by the non-doped diamond sublayer. The substrate having the insulating layers comprising at least one low dielectric constant insulating sublayer and at least one non-doped diamond sublayer has both the high speed of a semiconductor element and a good heat-dissipation efficiency. Specific examples of the material for the low dielectric constant insulating sublayer are polyimide resins, and poly(meth)acrylate esters such as poly (methyl methacrylate).

Although the low dielectric constant insulating sublayer is advantageous for the signal wiring layer which is required to have the high speed, the insulating sublayer preferably has the high relative dielectric constant in view of a power source wiring layer. Although a power source wiring sublayer is provided between the diamond thin film layers for such application, the use of a sublayer having a high dielectric constant (of preferably at least 12) can improve the stability of the voltage supply. Specific examples of the high dielectric constant material are $Ta_2O_5$, ZnO, PZT [Pb(Zr, Ti)$O_3$] and the like. For example, a Ta film is formed by the sputtering and anodically oxidized to prepare a $Ta_2O_5$ film. The combination of the low dielectric constant insulating sublayer and the high dielectric constant insulating sublayer can give the power source circuit which gives the stable power source voltage to the elements. Since the use of the high dielectric constant insulating sublayer can give a circuit having a capacity component near the element, it is advantageous for the stable supply of the power source voltage.

When the diamond layer is used, one or both of the low dielectric constant insulating sublayer and the high dielectric constant insulating sublayer are used as the insulating layer, and the metal wirings are formed in the insulating layer, then the multilayer wiring substrate can have the high performance. However, since it is difficult to continuously conduct the preparation of these layers in the same reactor, the multiple steps are necessary. A diamond layer which can have the good electrical conductivity may be formed in the diamond layer. A gas containing B (boron) can be fed during the gas phase deposition of diamond to prepare a B-doped diamond layer. As well known, non-doped diamond is insulating, but B-doped diamond can have the p-type semiconductivity. Specific examples of a dopant are B, P and the like. When the insulating diamond layer is formed and then the electrically conductive diamond layer is formed, the procedure is simple and the cost for the production is low.

Since polycrystalline diamond prepared by vapor phase deposition has rough surfaces, it is difficult to form the fine wiring on the diamond. When the multilayer circuit substrate is prepared, a hole for the wiring must be perforated through a plurality of sublayers so as to make the interlaminar connection of the wiring sublayers. We studied the procedure for decreasing the roughness of the growth surface of vapor phase deposition diamond and the procedure for perforating the hole for wiring through diamond, and then found that the processing method using an excimer laser is very effective. An absorption edge of diamond is at 225 nm. ArF excimer laser (193 nm) having a wavelength of shorter than 225 nm has very good processing efficiency. Other excimer lasers such as KrF laser (248 nm) and XeCl laser (308 nm) can have better efficiency than the conventionally used YAG laser. As the thickness of diamond increases during the vapor phase deposition of diamond, the particle sizes of diamond at an surface area increase and/or nonuniformity among the grown particles increases so that the surface roughness increases to have $R_{max}$ of 5–30 μm. In such case, since the roughness of the substrate layer gives effect on the next layer formed on the substrate layer, it is impossible to obtain a practically useful circuit substrate.

When the diamond layer surface is smoothed by the excimer laser so that $R_{max}$ of the surface is at most 1, the following layer can be accurately formed thereon. In particular, when the surface is smoothed, it is effective to scan excimer laser light with the linear focusing. In order to merely decrease the surface roughness, the surface facing the polycrystalline Si substrate material can be used for the diamond deposition. Light emitted from the excimer laser is focused on the diamond before the metal wiring sublayer deposition so as to decrease the surface roughness of the growing surface in a short time so that the metal wiring sublayer can be made fine and the high mounting density can be achieved. Through-holes can be perforated at desired points.

In the above structure, a semiconductor element can be mounted on the low dielectric constant insulating sublayer or high dielectric constant insulating sublayer, but cannot be mounted on diamond. Although this structure facilitates the mounting of semiconductor element, it disadvantageously has low heat dissipating property since the layer having a thermal conductivity smaller than diamond is present between diamond and the semiconductor element. The present invention provides the structure having the improved heat dissipating property, in which the semiconductor element is directly attached to diamond having the large thermal conductivity and the multisublayer wiring layer comprising the low or high dielectric constant sublayers and the metal wiring sublayers is formed beside the semiconductor element. If necessary, a hole for wiring may be prepared in the diamond-metal wiring layer by the use of an excimer laser and then the wiring may be connected. Since the wiring density in the diamond—metal wiring layer can be a small value, the high dielectric constant of diamond does not cause a problem in the mounting of the high speed semiconductor element. Preferably, the process for smoothing the surface is conducted by the use of excimer laser, before the deposition of the low or high dielectric constant insulating sublayer and the high dielectric constant insulating sublayer. When both a high speed semiconductor element and a power source circuit are mounted on the same substrate, a multisublayer wiring layer comprising the low dielectric constant sublayers is preferably formed near the high speed semiconductor element and a multisublayer wiring layer comprising high dielectric constant sublayers is preferably formed near a high output element of the power source circuit. The thus obtained substrate according to the present invention can be used also for a multichip module (MCM). Various semiconductor chips can be mounted on the multilayered wiring substrate of the present invention.

The structure of the substrate according to the present invention may be, for example, as follows:

(1) the non-doped diamond base material/the multisublayer wiring layer comprising diamond insulating sublayers/the multisublayer wiring layer comprising low or high dielectric constant insulating sublayers (The chip is mounted on the multisublayer wiring layer comprising low or high dielectric constant insulating sublayers) (cf. FIG. 2), (2) the non-doped diamond base material/the semiconductive diamond layer/the non-doped diamond layer/the multisublayer wiring layer comprising low (or high) dielectric constant insulating sublayers (The chip is mounted on the non-doped diamond layer) (cf. FIG. 3), (3) the non-doped diamond base material/the multisublayer wiring layer comprising low or high dielectric constant insulating sublayers/the non-doped diamond layer/the semiconductive diamond layer/the non-doped diamond layer/the multisublayer wiring layer comprising high (or low) dielectric constant insulating sublayers/the multisublayer wiring layer comprising low (or high) dielectric constant insulating sublayers (The chip is mounted on the non-doped diamond layer or the multisublayer wiring layer comprising low (or high) dielectric constant insulating sublayers) (cf. FIG. 4), (4) the non-doped diamond base material/the multisublayer wiring layer comprising low or high dielectric constant insulating sublayers (The chip is mounted on the multisublayer wiring layer comprising low or high dielectric constant insulating sublayers), (5) the non-doped diamond base material/the multisublayer wiring layer comprising diamond insulating sublayers (The chip is mounted on the multisublayer wiring layer), (6) the non-doped diamond base material/the semiconductive diamond layer/the non-doped diamond layer/the multisublayer wiring layer comprising low or high dielectric constant insulating sublayers (The chip is mounted on the multisublayer wiring layer comprising low or high dielectric constant insulating sublayers), (7) the non-doped diamond base material/the multisublayer wiring layer comprising diamond insulating sublayers/the first non-doped diamond layer/the semiconductive diamond layer/the second non-doped diamond layer/the multisublayer wiring layer comprising low or high dielectric constant insulating sublayers (The chip is mounted on the multisublayer wiring layer comprising low or high dielectric constant insulating sublayers), (8) the non-doped diamond base material/the semiconductive diamond layer/the non-doped diamond layer/the multisublayer wiring layer comprising diamond insulating sublayers/the multisublayer wiring layer comprising low or high dielectric constant insulating sublayers (The chip is mounted on the multisublayer wiring layer comprising low or high dielectric constant insulating sublayers), (9) the non-doped diamond base material/the multisublayer wiring layer comprising low or high dielectric constant insulating sublayers (The chip is mounted on the non-doped diamond base material),

(10) the non-doped diamond base material/the semiconductive diamond layer/the non-doped diamond layer/the multisublayer wiring layer comprising low or high dielectric constant insulating sublayers (The chip is mounted on the non-doped diamond layer),

(11) the non-doped diamond base material/the multisublayer wiring layer comprising diamond insulating sublayers/the first non-doped diamond layer/the semiconductive diamond layer/the second non-doped diamond layer/the multisublayer wiring layer comprising low or high dielectric constant insulating sublayers (The chip is mounted on the second non-doped diamond layer), and

(12) the non-doped diamond base material/the semiconductive diamond layer/the non-doped diamond layer/the multisublayer wiring layer comprising diamond insulating sublayers/the multisublayer wiring layer comprising low or high dielectric constant insulating sublayers (The chip is mounted on the multisublayer wiring layer comprising diamond insulating sublayers).

The multisublayer wiring layer comprising diamond insulating sublayers preferably has a thickness of 20 to 1,000 μm, more preferably 100 to 500 μm. The multisublayer wiring layer comprising low or high dielectric constant insulating sublayers preferably has a thickness of 20 to 2,000 μm more preferably 100 to 500 μm. The semiconductive diamond layer preferably has a thickness of 20 to 500 μm, more preferably 50 to 500 μm). The non-doped diamond layer preferably has a thickness of 50 to 500 μm, more preferably 100 to 500 μm.

The self-standing film of diamond (or non-doped diamond base material) has a thickness of at least 100 μm, preferably from 200 to 2,000 μm. Specific examples of the semiconductor element (which includes a semiconductor element chip) are a microprocessor unit, a power IC, a semiconductor laser and the like.

The thickness of the low or high dielectric constant sublayer (and the thickness of the diamond insulating sublayer) is preferably from 20 to 1,000 μm, more preferably from 100 to 300 μm. The thickness of the wiring sublayer is preferably from 0.1 to 10 μm, more preferably from 0.1 to 5 μm. The width of space between the wirings in a wiring sublayer plane is preferably from 50 to 5,000 μm.

Diamond may be polycrystal or single-crystal. Diamond can form the low dielectric constant insulating sublayer depending on the doping degree.

PREFERRED EMBODIMENT OF THE INVENTION

The present invention will be illustrated by the following Examples which do not limit the present invention.

EXAMPLE 1

Diamond having a thickness of the 200 μm was grown on a polycrystalline Si substrate material (25×25×5 mm) in a reactor by a hot filament CVD method. The deposition conditions were that a raw material gas of high-purity hydrogen containing 2% $CH_4$ was fed and that a temperature of the substrate material was 850° C. After the growth of diamond, the substrate material was removed from the reactor. Light emitted from KrF excimer laser was focused to have an output density of 5 $J/cm^2$ and scanned three times on the diamond growing surface to conduct the process for smoothing the diamond surface. A surface roughness $R_{max}$ was about 12 μm before the smoothing process and it was 0.5 μm after the smoothing process. After the smoothing process, the Si substrate material was dissolved in a chromium mixed acid to give a diamond self-standing film. A W (tungsten) metal was deposited in the thickness of 0.3 μm by a RF sputtering method on the smoothed surface. The W metal layer was patterned by a lithography technique to form a first layer circuit. Each of the width of wiring and the space between wirings was 20 μm. A wiring cut was not observed by a micrography. Another non-doped diamond layer was deposited in same manner as in the above, the smoothing process, the deposition of the W metal and the pattering were conducted to prepare another wiring layer.

In this way, a multilayered wiring substrate having the five metal wiring sublayers was prepared. The surface of the external diamond layer was smoothed. Polyimide-Cu multisublayer wiring layer (three sublayers) was formed by a conventional procedure on the external diamond layer (A relative dielectric constant of polyimide: 2). Light emitted from excimer laser was focused on a desired point to conduct the Via-hole process and an interlaminar wiring was formed through through-holes. Lastly, a semiconductor element chip (a microprocessor unit or a semiconductor laser) was connected by the bonding of an Au-Sn solder. The semiconductor element chip mounted on the resultant multilayered wiring substrate shown in FIG. 2 could stably operate for a long time and exhibited the good heat dissipation property and high speed signal transmission.

Figure 2:
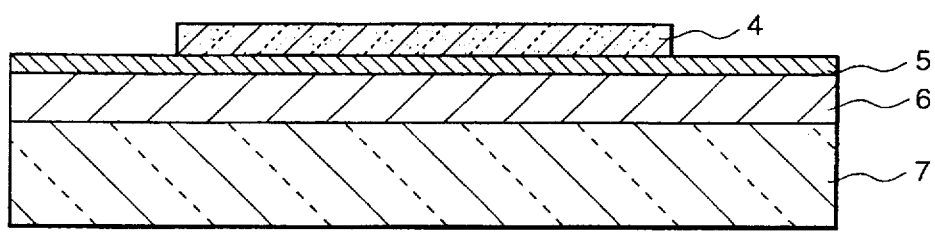
FIG. 2 shows a cross-sectional view of a substrate for the semiconductor device prepared in Example 1.

The device shown in FIG. 2 has a semiconductor element 4, a polyimide-Cu multisublayer wiring layer 5, a diamond-W multisublayer wiring layer 6 and a non-doped diamond layer 7.

EXAMPLE 2

In the same conditions as in Example 1, a diamond layer having a thickness of 1 mm was grown on a polycrystalline Si substrate material (25×25×5 mm) in a reactor by a hot filament CVD method. Then, a B-doped diamond layer having a thickness of 100 μm was deposited on the diamond layer. The deposition was Conducted under the conditions that $CH_4$ contained 1000 ppm $B_2H_6$. After discontinuing the incorporation of $B_2H_6$, a non-doped diamond layer having a thickness of 200 μm was grown. Then, the substrate material was removed from the reactor, and the surface was smoothed by the use of KrF excimer laser. The substrate material was treated with a mixed acid to prepare a self-standing diamond film. A polyimide-Cu multisublayer wiring in a width of 4 mm from edges was formed by the conventional method on the smoothed surface (A relative dielectric constant of polyimide: 4) (The wiring has a five-sublayer metal wiring). In the same manner as in Example 1, an interlaminar wiring was formed, a semiconductor element (a microprocessor unit) was mounted on a center part of the substrate, the bonding connection with the polyimide-Cu interlaminar wiring was formed to prepare a structure shown in FIG. 3. The Semiconductor element mounted on the resultant multilayered wiring substrate could stably operate for a long time and exhibited the good heat dissipation property and high speed signal transmission.

Figure 3:
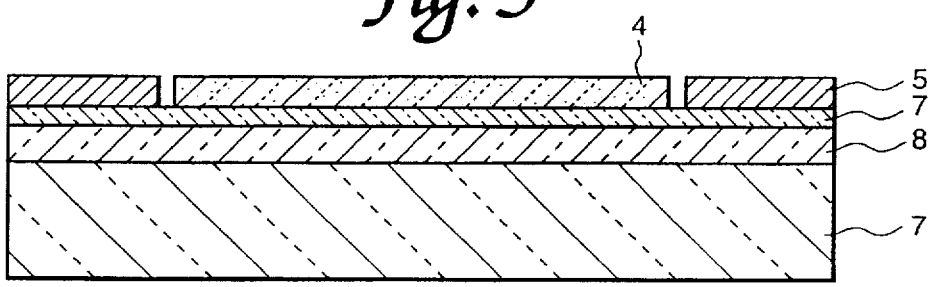
FIG. 3 shows a cross-sectional view of a substrate for the semiconductor device prepared in Example 2.

The device shown in FIG. 3 has a semiconductor element 4, a polyimide-Cu multisublayer wiring layer 5, non-doped diamond layers 7 and a B-doped diamond layer 8.

EXAMPLE 3

In the same conditions as in Example 1, a diamond layer having a thickness of 500 μm was grown on a polycrystalline Si substrate material (25×25×5 mm) in a reactor by a hot filament CVD method. The substrate material was removed from the reactor, and the surface was smoothed by the use of KrF excimer laser. The substrate was treated with a mixed acid to prepare a self-standing diamond film. A metal W was sputtered on the whole surface, and was patterned to prepare a wiring. Then, a non-doped diamond layer having a thickness of 200 μm, a B-doped diamond layer having a thickness of 100 μm and a non-doped diamond layer having a thickness of 100 μm were deposited under the same conditions as in Example 2. The B-doped diamond layer acted as a grounding layer.

With masking a part of the substrate on which a semiconductor element was mounted, a $Ta_2O_5$-W multisublayer wiring was repeatedly deposited and patterned to give a multisublayer wiring layer having two metal wiring sublayers (A relative dielectric constant of $Ta_2O_5$: 14). This multisublayer wiring layer acted as a power source circuit layer. A Cu-polyimide multisublayer wiring layer having three metal wiring sublayers was deposited to prepare a signal circuit layer so as to prepare a structure shown in FIG. 4 (A relative dielectric constant of polyimide: 4). During the preparation of the signal circuit layer, through-holes for interlaminar wiring were prepared by KrF excimer laser suitably used according to a circuit design. A semiconductor element (a microprocessor unit) was mounted on the resultant substrate, could stably work for a long time and exhibited the good heat-dissipation property of substrate and the good stability of power source circuit.

Figure 4:
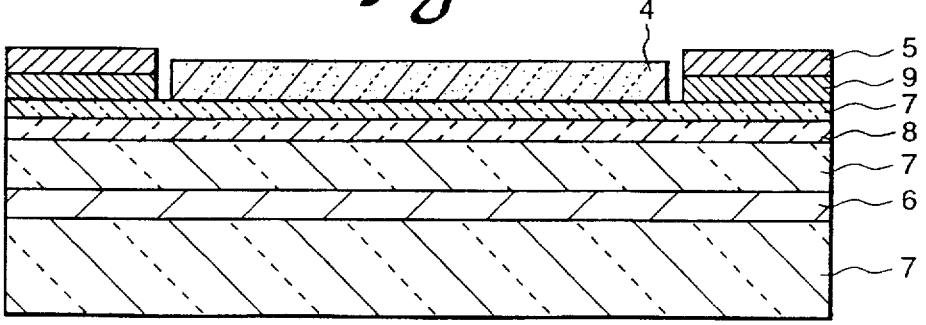
FIG. 4 shows a cross-sectional view of a substrate for the semiconductor device prepared in Example 3.

The device shown in FIG. 4 has a semiconductor element 4, a Cu-polyimide multisublayer wiring layer 5, a diamond-W multisublayer wiring layer 6, non-doped diamond layers 7, a B-doped diamond layer 8 and a $Ta_2O_5$-W multisublayer wiring layer 9.

According to the present invention, the semiconductor element mounted on the substrate, which have high speed operation and large consumed electric power, can stably operate. The present invention can give an electronic instrument comprising the semiconductor element having the high performance, the small size and the low cost. The substrate for the semiconductor element according to the present invention is effective on high-density mounting of a generalpurpose high out-put device.

What is claimed is:

1. A substrate for a semiconductor device comprising:
   first and second diamond base material layers which are spaced from each other, each of the diamond base material layers having opposing first and second surfaces and being prepared by vapor phase deposition;
   a first multisublayer wiring layer disposed on the first diamond base material layer, the first multisublayer wiring layer comprising at least one low dielectric constant insulating sublayer having a relative dielectric constant of not larger than 5 and at least one metal wiring sublayer;
   a second multisublayer wiring layer positioned between the first and second diamond base material layers; and
   a semiconductor element,
   wherein the semiconductor element and the first multisublayer wiring layer are mounted directly on and are thereby in direct contact with the first surface of the first diamond base material layer.

2. A substrate according to claim 1, wherein the first surface of the first diamond base material layer is an upper surface, and the second surface of the first diamond base material layer is a lower surface.

3. A substrate according to claim 2, wherein each of the at least one low dielectric constant insulating and at least one metal wiring sublayers are alternatingly positioned.

4. A substrate for a semiconductor device comprising:
   first and second diamond base material layers which are spaced from each other, each of the diamond base material layers having opposing first and second surfaces and being prepared by vapor phase deposition;
   a first multisublayer wiring layer disposed on the first diamond base material layer, the first multisublayer wiring layer comprising at least one high dielectric constant insulating sublayer having a relative dielectric constant of at least 12 and at least one metal wiring sublayer;
   a second multisublayer wiring layer positioned between the first and second diamond base material layers; and
   a semiconductor element,
   wherein the semiconductor element and the first multisublayer wiring layer are mounted directly on and are thereby in direct contact with the first surface of the first diamond base material layer.

5. A substrate according to claim 4, wherein the high dielectric constant insulating layer is selected from the group consisting of $Ta_2O_5$, ZnO, and $Pb(Zr, Ti)O_3$.

6. A substrate according to claim 4, wherein the first surface of the first diamond base material layer is an upper surface, and the second surface of the first diamond base material layer is a lower surface.

7. A substrate according to claim 4, wherein each of the at least one high dielectric constant insulating and at least one metal wiring sublayers are alternatingly positioned.

8. A substrate for a semiconductor device comprising:
   first and second diamond base material layers which are spaced from each other, each of the diamond base material layers having opposing first and second surfaces and being prepared by vapor phase deposition;
   at least one first multisublayer wiring layer comprising at least one low dielectric constant insulating sublayer having a relative dielectric constant of not larger than 5 and at least one metal wiring sublayer;
   at least one second multisublayer wiring layer comprising at least one high dielectric constant insulating sublayer having a relative dielectric constant of at least 12 and at least one metal wiring sublayer; and
   a semiconductor element,
   wherein the semiconductor element and one of the at least one first multisublayer wiring layer and the at least one second multisublayer wiring layer are mounted directly on and are thereby in direct contact with the first surface of the first diamond base material layer, and the other of the at least one first multisublayer wiring layer and the at least one second multisublayer wiring layer is positioned between the first and second diamond base material layers.

9. A substrate according to claim 8, wherein the high dielectric constant insulating layer is selected from the group consisting of $Ta_2O_5$, ZnO, and $Pb(Zr, Ti)O_3$.

10. A substrate according to claim 8, wherein the first surface of the first diamond base material layer is an upper surface, and the second surface of the first diamond base material layer is a lower surface.

11. A substrate according to claim 8, wherein each of the at least one low dielectric constant insulating and at least one metal wiring sublayers of the at least one first multisublayer wiring layer are alternatingly positioned, and wherein each of the at least one high dielectric constant insulating and at least one metal wiring sublayers of the at least one second multisublayer wiring layer are alternatingly positioned.

12. A substrate for a semiconductor device comprising:
   first and second diamond base material layers which are spaced from each other, each of the diamond base material layers having opposing first and second surfaces and being prepared by vapor phase deposition;
   a first multisublayer wiring layer disposed on the first diamond base material layer, the first multisublayer wiring layer comprising at least one diamond insulating sublayer prepared by vapor phase deposition and at least one metal wiring sublayer;
   a second multisublayer wiring layer positioned between the first and second diamond base material layers,
   wherein each of the at least one diamond insulating sublayer and the at least one metal wiring sublayer are alternatingly positioned, and wherein the semiconductor element and the first multisublayer wiring layer are mounted directly on and are thereby in direct contact with the first surface of the first diamond base material layer.

13. A substrate according to claim 12, wherein the first surface of the first diamond base material layer is an upper surface, and the second surface of the first diamond base material layer is a lower surface.

* * * * *